United States Patent
Steimle et al.

(10) Patent No.: US 9,443,782 B1
(45) Date of Patent: Sep. 13, 2016

(54) METHOD OF BOND PAD PROTECTION DURING WAFER PROCESSING

(71) Applicant: FREESCALE SEMICONDUCTOR, INC., Austin, TX (US)

(72) Inventors: Robert F. Steimle, Austin, TX (US); Dwight L. Daniels, Phoenix, AZ (US); Veera M. Gunturu, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/823,069

(22) Filed: Aug. 11, 2015

(51) Int. Cl.
| | |
|---|---|
| H01L 21/00 | (2006.01) |
| H01L 23/31 | (2006.01) |
| H01L 21/02 | (2006.01) |
| H01L 21/82 | (2006.01) |
| H01L 21/56 | (2006.01) |
| H01L 23/00 | (2006.01) |

(52) U.S. Cl.
CPC ..... *H01L 23/3157* (2013.01); *H01L 21/02013* (2013.01); *H01L 21/561* (2013.01); *H01L 21/82* (2013.01); *H01L 23/564* (2013.01)

(58) Field of Classification Search
CPC ....... H01L 24/13; H01L 24/10; H01L 24/81; H01L 2221/6834; H01L 2224/13099; H01L 2224/81815; H01L 2224/83102; H01L 2924/01027; H01L 2924/01074; H01L 2924/01077; H01L 2924/14
USPC .......................................... 438/465
See application file for complete search history.

(56) References Cited

U.S. PATENT DOCUMENTS

| 7,279,362 B2 * | 10/2007 | Li ....................... H01L 21/6835 257/E21.508 |
| 8,119,500 B2 | 2/2012 | Yang et al. |
| 8,765,578 B2 | 7/2014 | La Tulipe, Jr. et al. |
| 8,841,758 B2 | 9/2014 | Daniels et al. |
| 2007/0190747 A1 * | 8/2007 | Humpston .......... B81C 1/00285 438/460 |
| 2008/0292790 A1 * | 11/2008 | Lebrette .............. C23C 18/1208 427/226 |

OTHER PUBLICATIONS

K.C. Su, "A Novel Water-Washable Coating for Avoiding Contamination During Dry Laser Dicing Operations", CS MANTECH Conference, May 14-17, 2007, Austin, Texas, USA.*

(Continued)

*Primary Examiner* — Tod T Van Roy
*Assistant Examiner* — Vu A Vu
(74) *Attorney, Agent, or Firm* — Charlene R. Jacobsen

(57) ABSTRACT

A method for protecting terminal elements on a wafer during wafer level fabrication processes entails applying a protective coating to the terminal elements prior to further processing operations. These processing operations may include back side grinding of the wafer and/or saw-to-reveal operations to expose the terminal elements from a cap wafer of a wafer structure. The protective coating can protect the terminal elements from potentially damaging contaminants, such as debris from the grinding or saw-to-reveal operations. Furthermore, the protective coating can protect the bond pads from coming into contact with a rapidly oxidizing environment when exposed to water. The protective coating may be a hot-water soluble thermoplastic material the melts from a solid form to a liquid form at a relatively low temperature to enable application of the protective coating in liquid form onto the terminal elements and clean removal of the protective coating from the terminal elements.

16 Claims, 8 Drawing Sheets

(56) References Cited

OTHER PUBLICATIONS

Fauty et al, "Al—Cu Metal Bond Pad Corrosion During Wafer Saw", The International Journal of Microcircuits and Electronic Packaging, 2001, pp. 19-29, vol. 24, No. 1.

Dalvi-Malhotra et al, "Use of silane-based primer on silicon wafers to enhance adhesion of edge-protective coatings during wet etching: Application of the TALON Wrap (TM) process", Proceedings of SPIE, 2007, pp. 64620B-1-64620B-7, vol. 6462.

\* cited by examiner

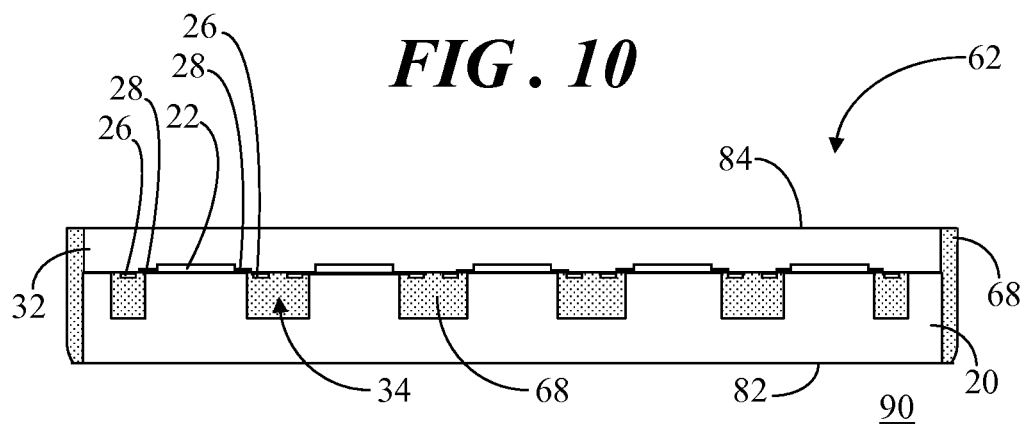
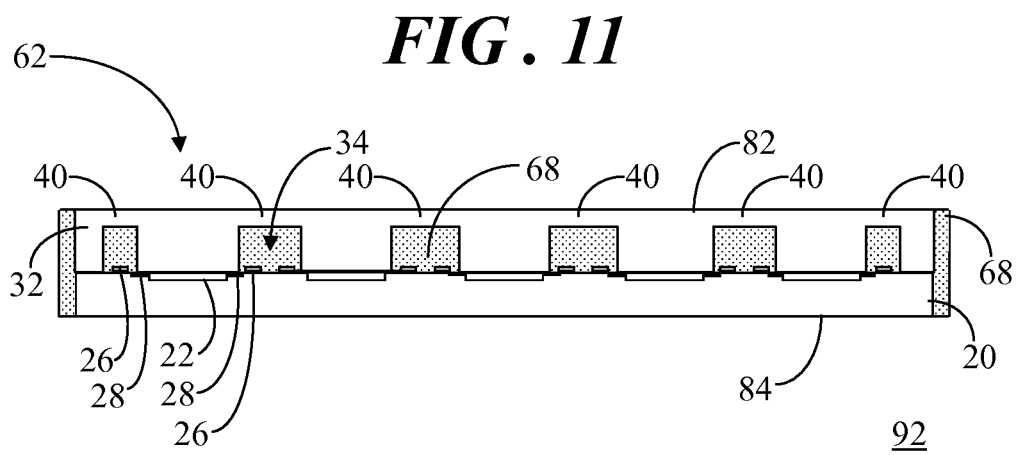
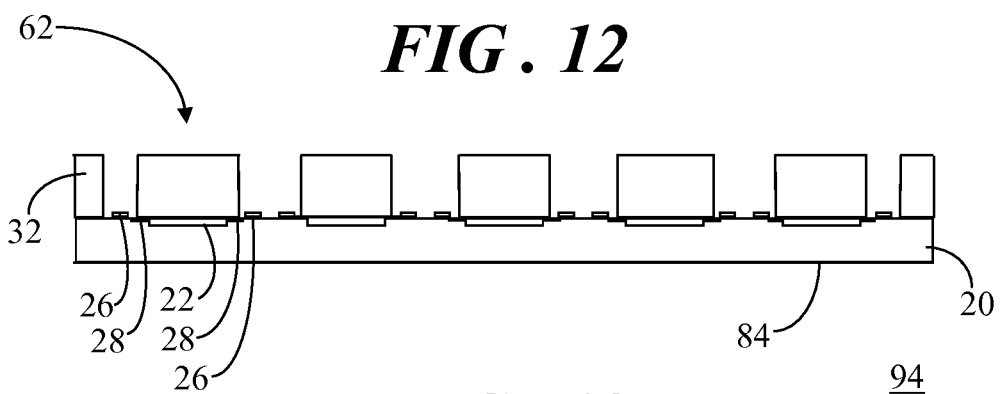
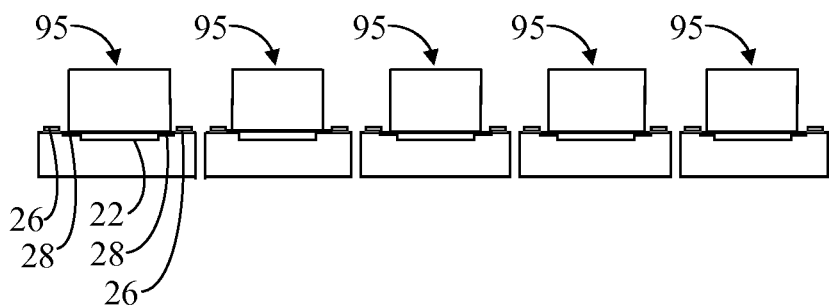

METHOD OF BOND PAD PROTECTION DURING WAFER PROCESSING

TECHNICAL FIELD OF THE INVENTION

The present invention relates generally to bonded semiconductor wafers. More specifically, the present invention relates to protecting bond pads of a bonded semiconductor wafer structure during processing.

BACKGROUND OF THE INVENTION

Semiconductor manufacturing processes often implement one of a number of wafer bonding techniques. Wafer bonding is a packaging technology performed at wafer-level for the fabrication of, for example, microelectromechanical systems (MEMS), nanoelectromechanical systems (NEMS), microelectronics, and optoelectronics devices. By way of example, a plurality of MEMS devices may be fabricated on a device wafer. A cap wafer may then be bonded to the device wafer in order to provide protection for the sensitive structures on the device wafer from environmental influences such as temperature, moisture, high pressure, and oxidizing agents. The stacked wafer structure of the device wafer with the cap wafer may subsequently undergo wire bonding, device testing, and singulation operations in order to produce a plurality of individual devices.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

FIG. 10 shows a simplified side view of the wafer structure of FIG. 9 at a subsequent stage of processing;

FIG. 11 shows a simplified side view of the wafer structure of FIG. 10 at a subsequent stage of processing;

FIG. 12 shows a simplified side view of the wafer structure of FIG. 11 at a subsequent stage of processing;

FIG. 13 shows a simplified side view of devices produced in accordance with the fabrication process of FIG. 4;

DETAILED DESCRIPTION

In overview, the present disclosure concerns methodology for protecting terminal elements, referred to herein as bond pads, during wafer level fabrication processes. More particularly, a protective coating is applied to the bond pads and bond shelf after a wafer bonding process, but prior to other processing operations such as wafer grinding and saw-to-reveal. The protective coating can protect the bond pads and bond shelf from potentially damaging contaminants, such as debris from the grinding or saw-to-reveal operations. Furthermore, the protective coating can protect the bond pads from coming into contact with a rapidly oxidizing environment when exposed to water. The protective coating is removed after completion of any such processing that may produce contaminants capable of damaging the bond pads. Moreover, depending upon the type of protective coating that is used, the protective coating may not require any additional removal operations to be incorporated into the fabrication process. Thus, the methodology disclosed herein can cost effectively improve device yield and manufacturability.

The instant disclosure is provided to explain in an enabling fashion the best modes, at the time of the application, of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued. Additionally, it should be understood that the use of relational terms, if any, such as first and second, top and bottom, and the like are used solely to distinguish one from another entity or action without necessarily requiring or implying any actual such relationship or order between such entities or actions.

Figure 1:
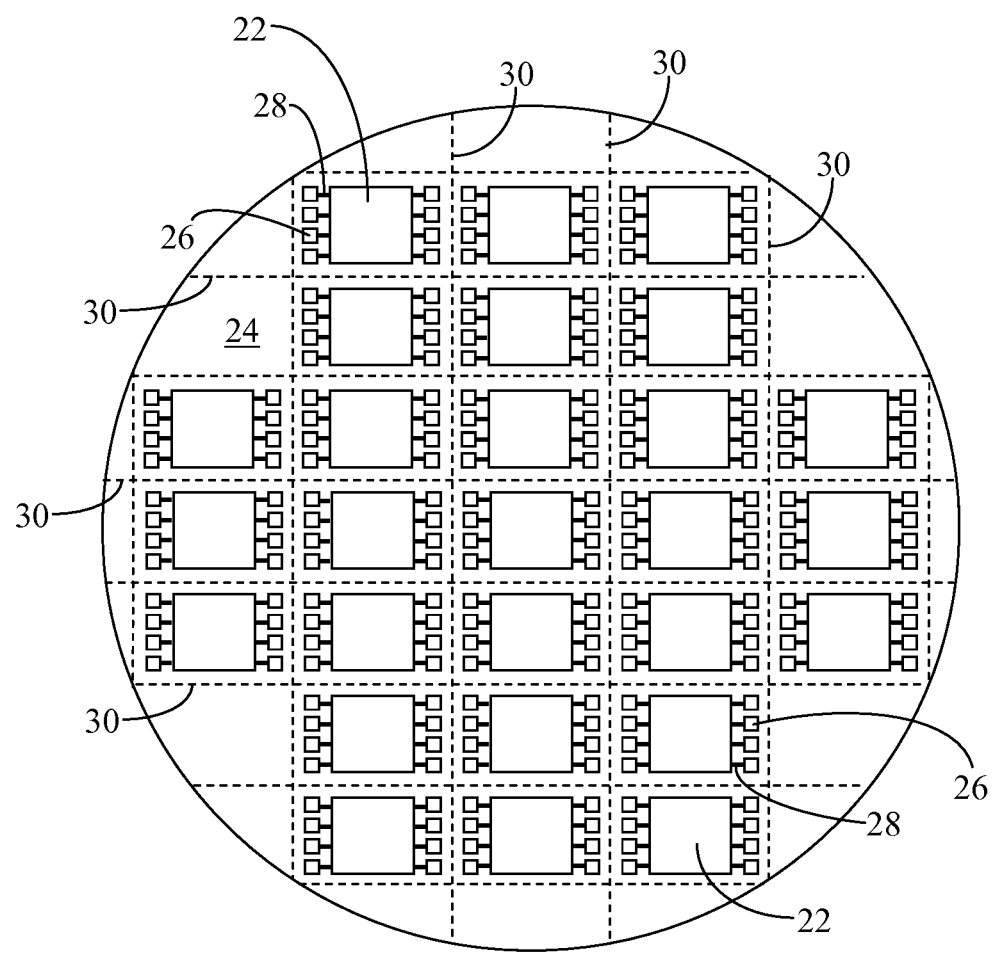
FIG. 1 shows a top view of a device wafer in a simplified and representative form.

Referring to FIG. 1, FIG. 1 shows a top view of a first wafer, referred to herein as a device wafer 20, in a simplified and representative form. Device wafer 20 includes a plurality of devices 22 formed on or in a surface 24 of device wafer 20. Devices 22 represent a wide variety of components such as microelectromechanical systems (MEMS) devices, nanoelectromechanical systems (NEMS) devices, microelectronics devices, optoelectronics devices, electromagnetic devices, chemical devices, integrated circuits, or some other electronic devices that contain micron and/or sub-micron sized components. Additionally, each device 22 is represented by a single rectangle for simplicity. However, this particular configuration is not a requirement. Rather, each of devices 22 may be a single component or multiple components best suited for a particular design configuration.

Device wafer 20 includes only a few devices 22 again for simplicity. Those skilled in the art will recognize that a device wafer may include tens, hundreds, or even thousands of devices 22. Furthermore, device wafer 20 is illustrated as being generally disk-shaped. However, alternative embodiments may be any suitable shape, such as rectangular shaped.

Each of devices 22 includes one or more terminal elements, referred to herein as bond pads 26. Bond pads 26 may be electrically connected to various structures and/or electrodes of devices 22 via conductive traces 28. In the simplified illustration, bond pads 26 and conductive traces 28 are located on two sides of each of devices 22. However, this particular configuration is not a requirement. Rather, bond pads 26 and conductive traces 28 may be arranged in any suitable configuration in accordance with a particular design configuration.

Device wafer 20 may be manufactured utilizing conventional and upcoming bulk micromachining, surface micromachining, and/or high aspect ratio silicon micromachining techniques. Fabrication processes for a surface micromachining technique can generally include, for example, deposition, patterning, and etching of one or more sacrificial oxide layers, one or more structural polysilicon layers, and the like. For example, one or more sacrificial oxide layers may be deposited overlying the silicon-based wafer, and one or more structural layers may then be deposited over the sacrificial layers.

Dashed lines 30 represent borders delineating each device 22 (as well as its bond pads 26 and conductive traces 28). Dashed lines 30 can additionally represent the locations at which device wafer 20 may eventually be sawn, diced, etched, or otherwise singulated. Hence, dashed lines 30 are referred to hereinafter as scribe lines 30. Scribe lines 30 represent the non-functional spacing where device wafer 20 can be safely cut without damaging the circuits.

Figure 2:
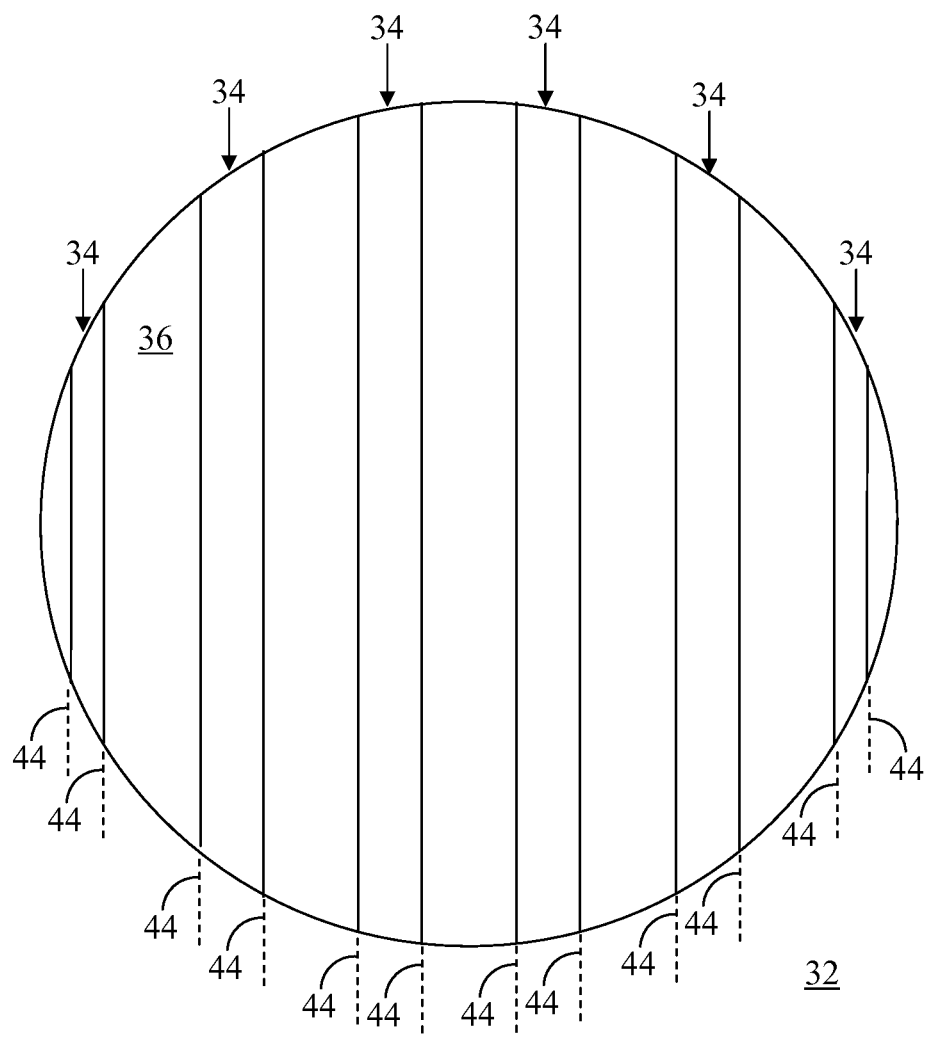
FIG. 2 shows a top view of a cap wafer in a simplified and representative form.
Figure 3:
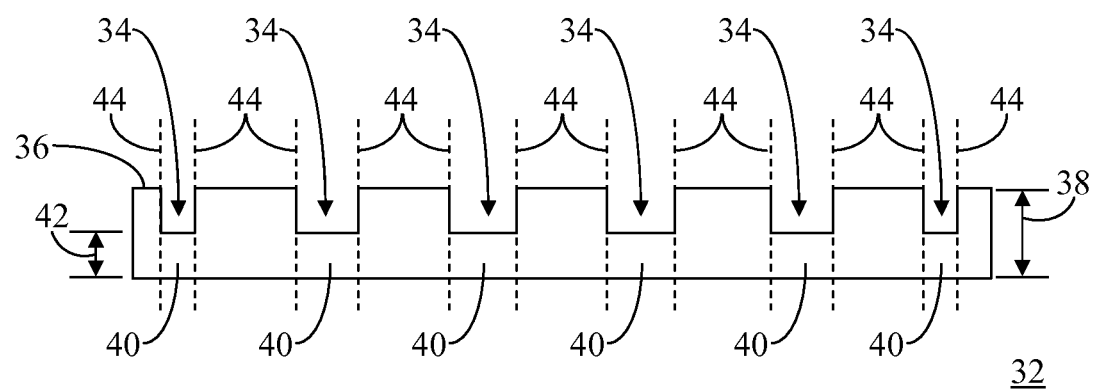
FIG. 3 shows a side view of the cap wafer of FIG. 2.

Referring now to FIGS. 2 and 3, FIG. 2 shows a top view of a second wafer, referred to herein as a cap wafer 32, in a simplified and representative form and FIG. 3 shows a side view of cap wafer 32. Some device designs call for a cap or lid to seal the individual devices 22 (FIG. 1) on device wafer 20 (FIG. 1) in order to protect devices 22 from environmental influences such as temperature, moisture, high pressure, and oxidizing agents. Thus, cap wafer 32 may be bonded or otherwise coupled to device wafer 20 (FIG. 1) to form a wafer structure. The stacked wafer structure of the device wafer with the cap wafer may subsequently undergo wire bonding, device testing, and singulation operations in order to produce a plurality of individual devices.

In one configuration, cap wafer 32 may include a number of channels 34 extending inwardly from a cap surface 36 and partially through a thickness 38 of cap wafer 32. As will be discussed in greater detail below, these channels 34 may be arranged facing bond pads 26 (FIG. 1) of device wafer 20 when cap wafer 32 is coupled with device wafer 20. Thus, a material portion 40 of cap wafer 32 aligned with channel 34 will be aligned with bond pads 26. This material portion 40 has a thickness 42 that is less than thickness 38 of cap wafer 32. As such, material portion 40 will be vertically displaced away from bond pads 26 when cap wafer 32 is coupled to device wafer 32.

In the illustrated embodiment of FIGS. 2 and 3, dashed lines 44 bordering each channel 34 represent the locations at which material portion 40 of cap wafer 32 will be removed in order to access bond pads 26 of device wafer 20 (discussed below). These dashed lines 44 are referred to hereinafter as saw-to-reveal lines 44. Therefore, each pair of saw-to-reveal lines 44 delineates material portion 40 of cap wafer 32 to be removed in order to expose (i.e., reveal) the underlying bond pads 26 formed on device wafer 20. Although cap wafer 32 is provided with channels 34, in alternative embodiments, a cap wafer need not include channels. Rather, the cap wafer may be a consistent thickness and the channels are formed when the cap wafer is coupled to device wafer 20 by virtue of a material stand-off (such as polysilicon and glass frit).

In some embodiments, cap wafer 32 may additionally include cavities (not shown) extending inwardly from cap surface 36 so as to provide clearance for devices 22 on surface 24 of device wafer 20. By way of example, devices 22 may include components, such as sensors, with moving elements. These cavities provide the necessary space for enabling movement of the moving elements.

In wafer-level manufacturing, wafers (e.g., device wafer 20 and/or cap wafer 32) typically require back side grinding to thin the wafers to a final thickness. Additionally or alternatively, wafer structures formed by coupling one wafer with another (e.g. coupling cap wafer 32 with device wafer 20) sometimes require a saw-to-reveal process to be performed to expose the terminal elements (e.g., bond pads 26) for wire bonding during assembly. During these operations, it is possible for debris from the process to contaminate and/or damage the terminal elements and surrounding structures. Embodiments disclosed herein can eliminate or largely prevent damage to the terminal elements during processing operations, such as back side grinding and/or saw-to-reveal processing.

The bond pads can also suffer from corrosion that can occur in a wet environment during processing, such as during a wafer saw process. For example, an electrostatic potential in the water can result in a rapid oxidation of bond pad aluminum once the native aluminum oxide breaks down. Accordingly, embodiments disclosed herein can largely prevent corrosion of the bond pads and/or the conductive traces. Moreover, corrosion prevention of the bond pads and/or the conductive traces can be achieved in either a wafer structure of coupled device and cap wafers or when the device wafer does not require a cap wafer.

Figure 4:
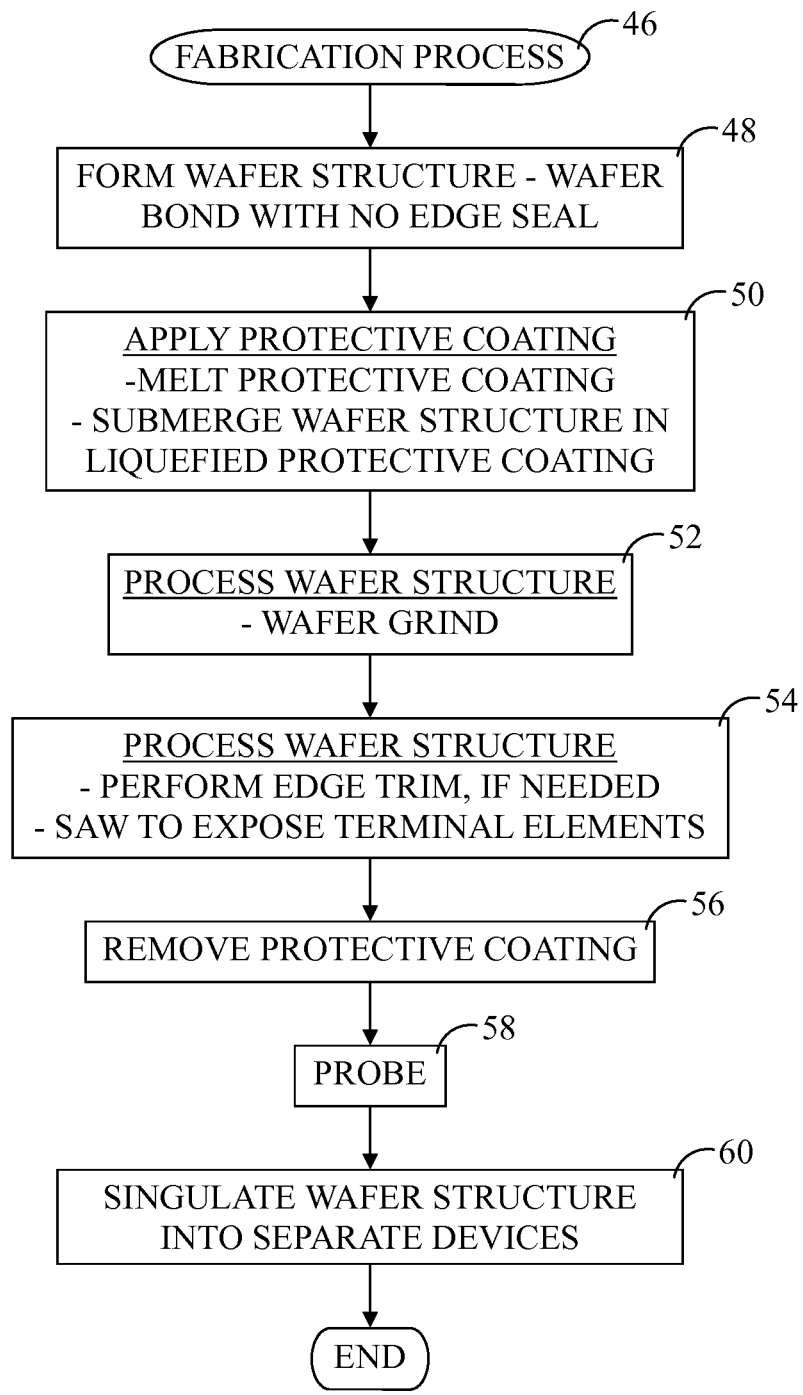
FIG. 4 shows a flowchart of a fabrication process in accordance with an embodiment.

FIG. 4 shows a flowchart of a fabrication process 46 in accordance with an embodiment. More particularly, fabrication process 46 sets forth a modified wafer-level packaging technique in which the terminal elements, e.g., bond pads and the bond shelf at which they are located, are protected from contaminants that are capable of damaging the terminal elements during processing. These contaminants can include debris from back side grinding, debris from the saw-to-reveal operations, corrosion causing water, and/or atmospheric born corroding chemicals. For clarity, fabrication process 46 is described in connection with protecting the bond pads of a wafer structure that includes cap wafer 32 coupled with device wafer 20. It should be understood, however, that fabrication process 46 may be implemented in a various processes with a variety of cap and device wafers to protect sensitive terminal elements from contaminants during processing. Furthermore, it bears repeating that certain operations described herein may be modified to protect the terminal elements of a device wafer even when it is not coupled with a cap wafer.

In a block 48 of fabrication process 46, a wafer structure is formed that includes cap wafer 32 coupled with device wafer 20. Cap wafer 32 may be coupled with device wafer 20 by implementing any of a variety of wafer bonding techniques. These wafer bonding techniques may include glass frit bonding, eutectic bonding (for example, aluminum germanium bonding), metal thermo compression bonding, or other bonding methods. In this illustrated embodiment, the resulting wafer structure does not include an edge seal (discussed below). In a block 50, a soluble protective coating is applied to the wafer structure and particularly to the terminal elements. Block 50 generally entails melting the soluble protective coating from a solid form to a liquid form, submerging the wafer structure into the liquefied soluble protective coating, and allowing the soluble protective coating to return to a solid form on the terminal elements.

After the soluble protective coating has been applied in accordance with block 50, a block 52 entails a wafer processing operation. For example, a back side grind process may be performed on the back side of device wafer 20 and/or on the back side of cap wafer 32. A block 54 entails another wafer processing operation. For example, a perimeter edge of the wafer structure may be trimmed and a saw-to-reveal process may be performed to expose the terminal elements. At a block 56, the soluble protective coating is removed. As will be discussed in greater detail below, the soluble protective coating removal of block 56 may be performed concurrent with the saw-to-reveal process of block 54 and/or the removal process of block 56 may be performed separate from the saw-to-reveal process of block 54.

After the soluble protective coating is removed at block 56, wafer probe testing may be performed at a block 58 to test the functionality of devices 22 on device wafer using the exposed bond pads 26. Thereafter, the wafer structure may be sawn, diced, etched, or otherwise singulated into separate device packages containing devices 22. Additional activities that may ensue following singulation block 60 can include, for example, binning or otherwise sorting the device packages, wire bonding with an application specific integrated circuit, overmolding, and so forth. These additional operations are not described herein for brevity. Thereafter, fabrication process 46 ends.

Figure 5:
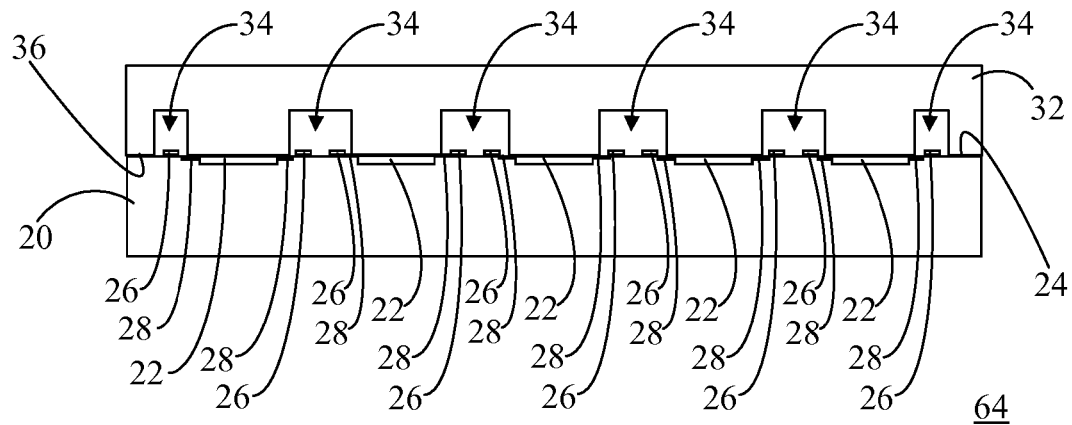
FIG. 5 shows side view of a wafer structure formed at an initial stage of processing in accordance with the fabrication process of FIG. 4.

Referring to FIG. 5 in connection with fabrication process 46 (FIG. 4), FIG. 5 shows side view of a wafer structure 62 formed at an initial stage 64 of processing. In accordance with block 48 of fabrication process 46, wafer structure 62 is formed. For example, cap surface 36 of cap wafer 32 is coupled with surface 24 of device wafer 20. As shown devices 22, bond pads 26, and conductive traces 28 are located between device and cap wafers 20, 32. Furthermore, channels 34 extending inwardly from cap surface 36 of cap wafer 32 are arranged in overlying relationship facing bond pads 26.

Figure 6:
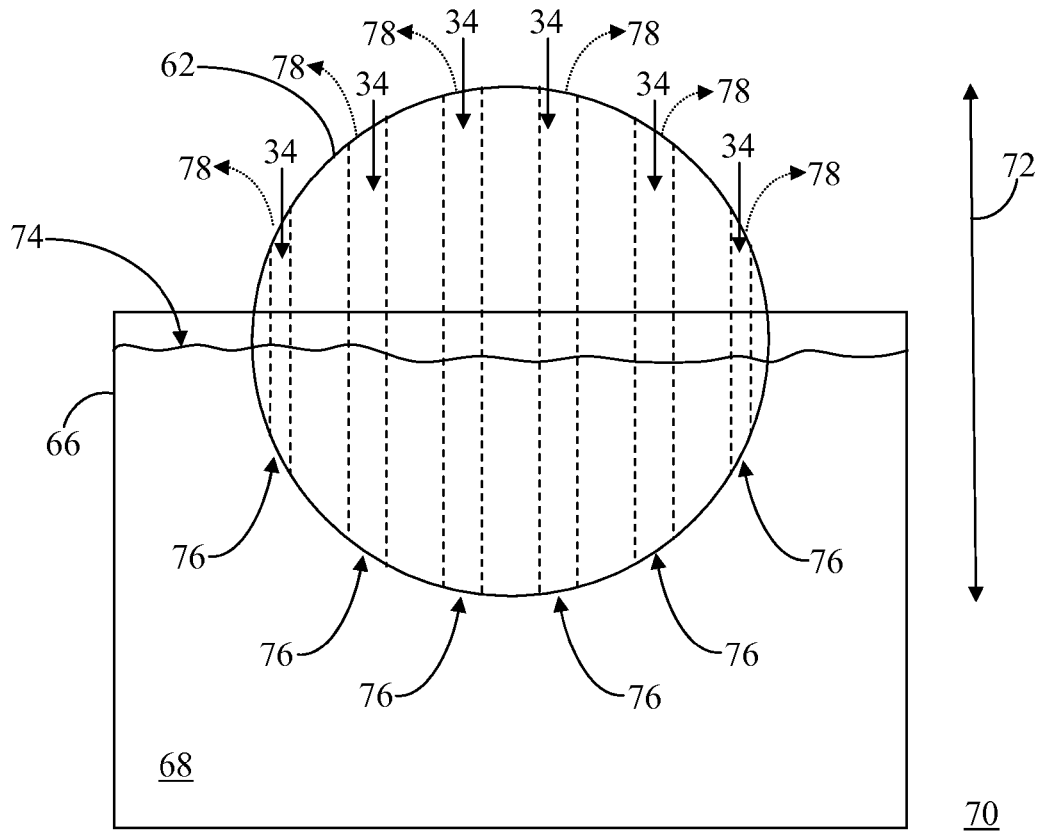
FIG. 6 shows a simplified side view of the wafer structure of FIG. 5 being submerged in a reservoir of a soluble protective coating at a subsequent stage of processing.

Now referring to FIG. 6 in connection with fabrication process 46 (FIG. 4), FIG. 6 shows a simplified side view of wafer structure 62 being submerged in a reservoir 66 of a soluble protective coating 68 at a subsequent stage 70 of processing. In accordance with block 50 of fabrication process 46, soluble protective coating 68 is applied to wafer structure 62. In an embodiment, soluble protective coating 68 may be one of a hot-water soluble adhesive, a hot-water soluble thermoplastic material, and a hot-water soluble thermosetting polymer material. Soluble protective coating 68 may be provided in a solid form. In accordance with block 50, heat is applied to the solid soluble protective coating 68 at a temperature sufficient to cause soluble protective coating 68 to liquefy, i.e., to melt.

An exemplary product that may be used as a soluble protective coating is AquaBond® ABS-55 or ABS-65 (AquaBond is a trademark of AquaBond Technologies, Inc., of Camarillo, Calif.). AquaBond is a hot-water soluble thermoplastic material typically used as a temporary adhesive. ABS-55 has a melting temperature of approximately fifty-five degrees Celsius and ABS-65 has a melting temperature of approximately sixty-five degrees Celsius. Therefore, the solid form of soluble protective coating 68 may be heated to at least fifty-five degrees Celsius if ABS-55 is used or to at least sixty-five degrees Celsius if ABS-65 is used. AquaBond is advantageously non-reactive and non-corrosive, and is adequately solid when cured (i.e., allowed to harden). But after it has hardened, it readily and cleanly rinses away in hot water.

In accordance with block 50 of fabrication process 46, wafer structure 62 is fully submerged into reservoir 66 of soluble protective coating 68. More particularly, wafer structure 62 is oriented such that a longitudinal dimension 72 of channels 34 is oriented approximately perpendicular to a surface 74 of the liquefied soluble protective coating 68. Due to the relatively low viscosity of soluble protective coating 68 and the particular orientation of wafer structure 62 relative to surface 74, soluble protective coating 68 will flow into channels 34 as denoted by solid arrows 76. Furthermore, air bubbles will flow out of the top end of channels 34 as denoted by dotted arrows 78.

Figure 7:
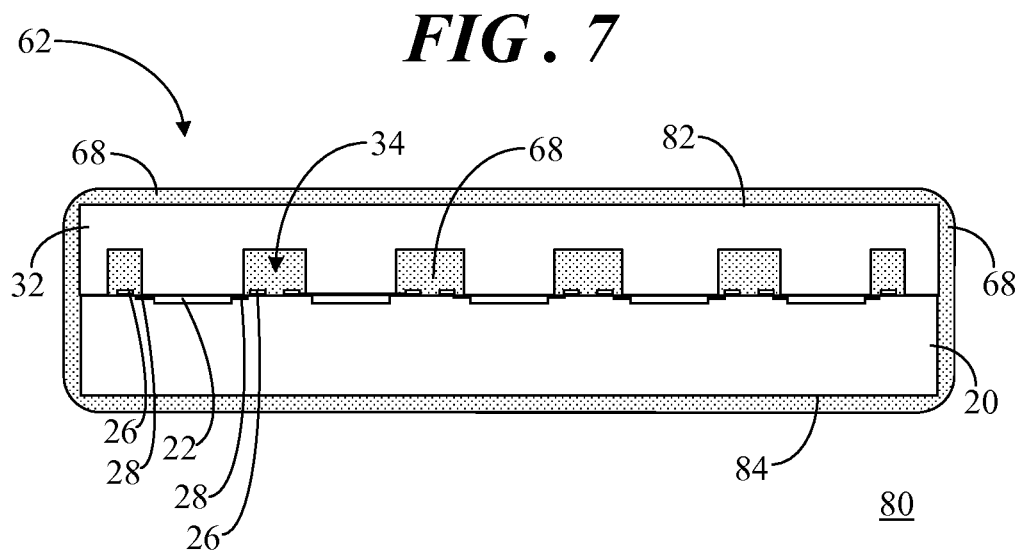
FIG. 7 shows a simplified side view of the wafer structure of FIG. 6 at a subsequent stage of processing.

Referring now to FIG. 7, FIG. 7 shows a simplified side view of wafer structure 62 at a subsequent stage 80 of processing. In FIG. 7, the now solidified soluble protective coating 68 is represented by a stippled pattern. After wafer structure 62 is removed from reservoir 66 (FIG. 6) and is left in room temperature, soluble protective coating 68 will solidify thus coating bond pads 26 within channels 34, as well as coating any exposed surface of device wafer 20 upon which bond pads 26 are formed (i.e., referred to as bond shelves). Some residual soluble protective coating 68 may additionally coat the outer surfaces of wafer structure 62, for example, an outer cap surface 82 of cap wafer 32 and/or an outer surface 84 of device wafer 20.

Figure 8:
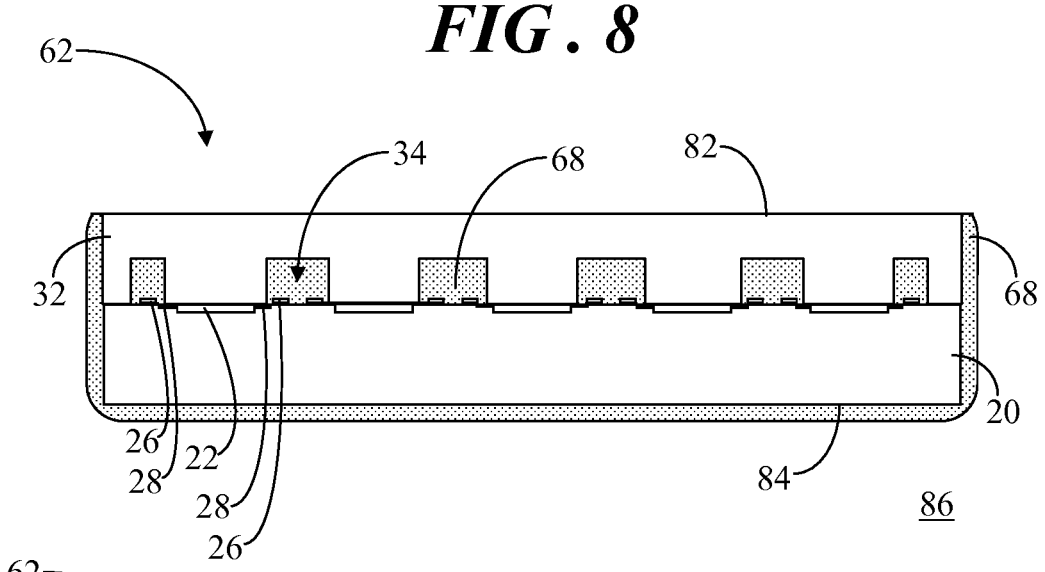
FIG. 8 shows a simplified side view of the wafer structure of FIG. 7 at a subsequent stage of processing.

FIG. 8 shows a simplified side view of wafer structure 62 at a subsequent stage 86 of processing. At stage 80, soluble protective coating 68 on outer cap surface 82 of cap wafer 32 may simply be rinsed away using heated water to expose outer cap surface 82.

Figure 9:
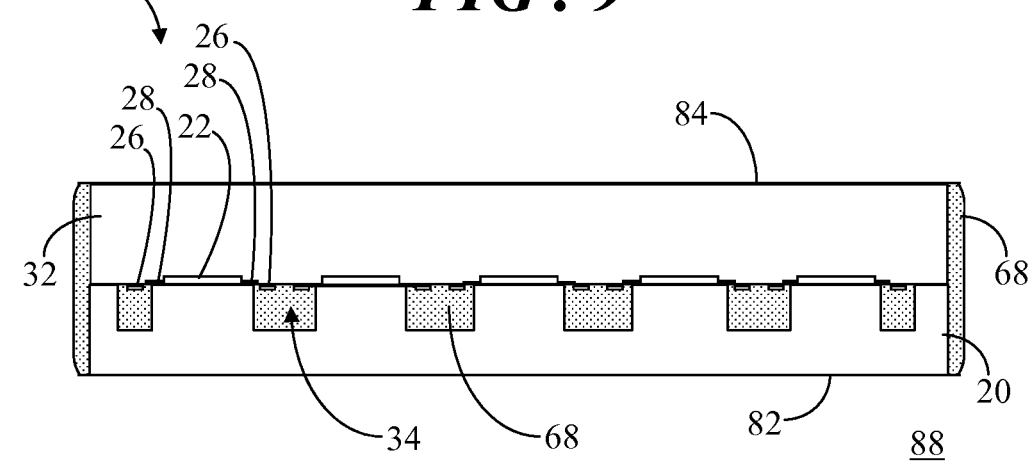
FIG. 9 shows a simplified side view of the wafer structure of FIG. 8 at a subsequent stage of processing.

FIG. 9 shows a simplified side view of wafer structure 62 at a subsequent stage 88 of processing. At stage 88, wafer structure 62 is flipped and soluble protective coating 68 on outer surface 84 of device wafer 20 is rinsed away using heated water to expose outer surface 84 of device wafer 20. It should be observed, that the solidified soluble protective coating 68 remains inside channels 34 thereby protecting bond pads 26.

Referring now to FIG. 10, FIG. 10 shows a simplified side view of wafer structure 62 at a subsequent stage 90 of processing. In accordance with block 52 of fabrication process 46 (FIG. 4), outer surface 84 of device wafer 20 may be thinned to a suitable thickness using a back grinding process. Soluble protective coating 68 inside channels 34 suitably protects bond pads 26 from any contaminants produced by the back grinding process.

FIG. 11 shows a simplified side view of wafer structure 62 at a subsequent stage 92 of processing. In accordance with block 52 of fabrication process 46, wafer structure 62 may be flipped and outer cap surface 82 of cap wafer 32 may also be thinned to a suitable thickness using a back grinding process. Again, soluble protective coating 68 inside channels 34 suitably protects bond pads 26 from any contaminants produced by the back grinding process.

Now referring to FIG. 12, FIG. 12 shows a simplified side view of wafer structure 62 at a subsequent stage 94 of processing. In accordance with block 54 of fabrication process 46, wafer structure 62 undergoes a saw-to-reveal process in order to expose bond pads 26. By way of example, cap wafer 32 is sawn, etched, or otherwise processed along saw-to-reveal lines 44 (FIGS. 2 and 3) to remove material portion 40 (FIG. 11) overlying bond pads 26. Soluble protective coating 68 inside channels 34 suitably protects bond pads 26 from contaminants produced by the saw-to-reveal process. A saw-to-reveal process may use water to rinse away contaminants produced during removal of material portion 40. If the water is sufficiently warmed, e.g., at a temperature greater than fifty-five degrees Celsius, the water will also cause soluble protective coating 68 to go into solution and release from bond pads 26. Additionally, or alternatively, following the saw-to-reveal process, bond pads 26 may undergo a separate rinse process in heated water to dissolve soluble protective coating 68. And in still other embodiments, the water used during the saw-to-reveal process need not be heated. Instead, soluble protective coating 68 may simply be rinsed away by the pressure and/or agitation of the water at an ambient temperature during the saw-to-reveal process.

FIG. 13 shows a simplified side view of device packages 95 produced in accordance with block 60 of fabrication process 46 (FIG. 4). As shown in FIG. 13, wafer structure 62 (FIG. 12) has been sawn, diced, etched, or otherwise singulated to produce a plurality of separated and packaged devices 22, each including its associated bond pads 26 and conductive traces 28.

Figure 14:
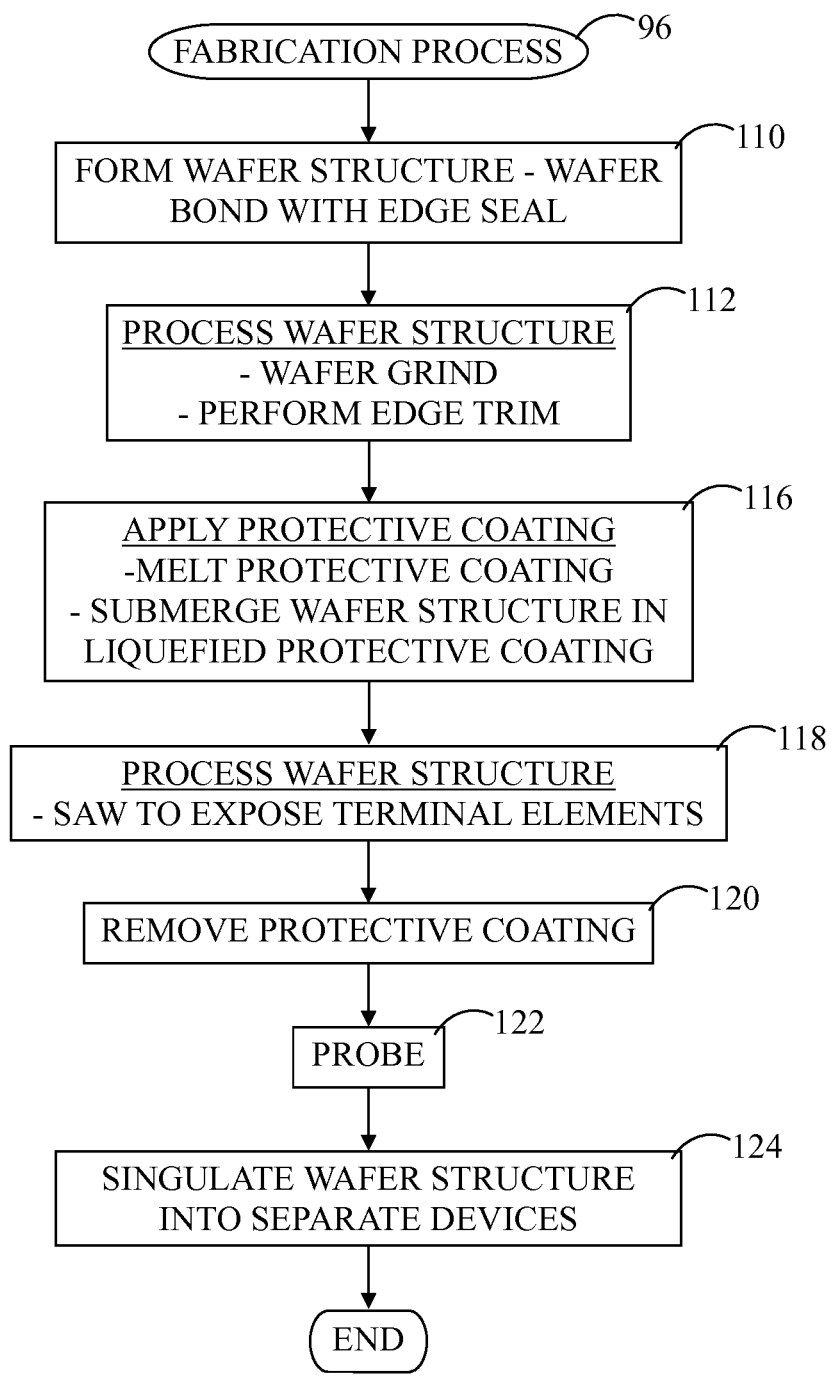
FIG. 14 shows a flowchart of a fabrication process in accordance with an alternative embodiment.
Figure 15:
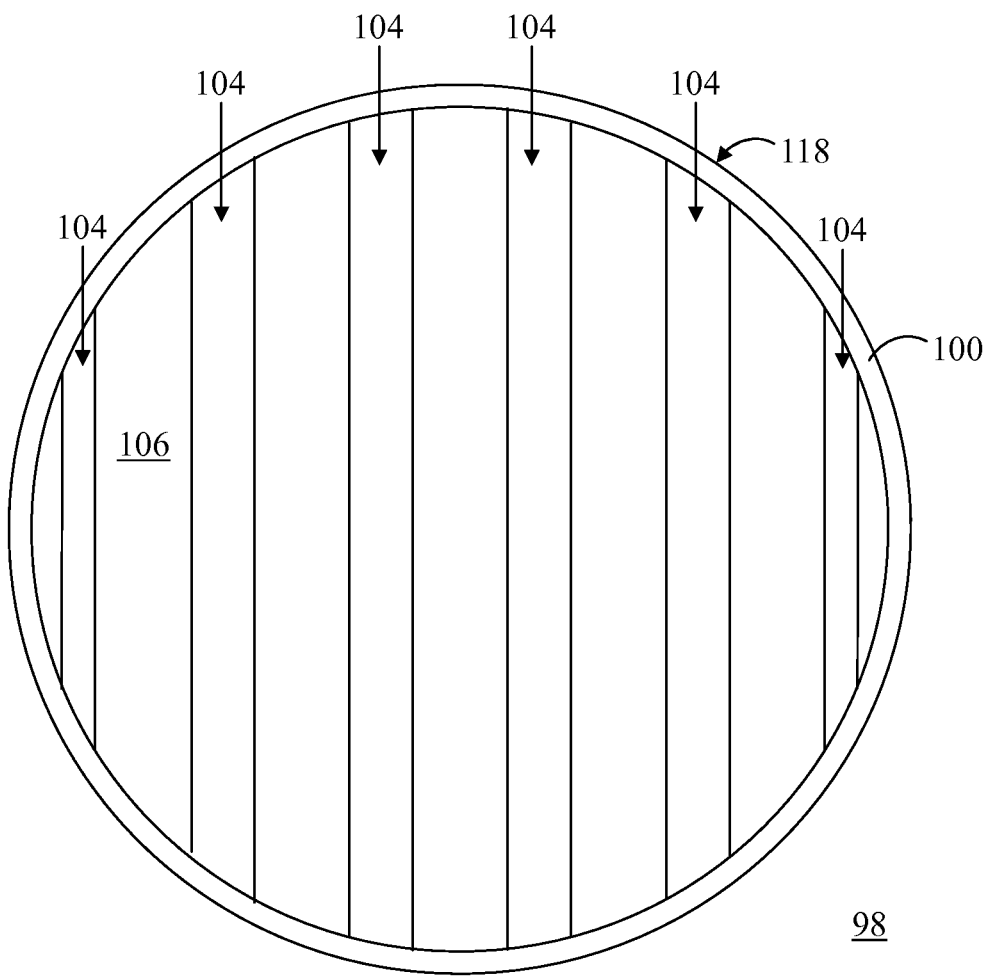
FIG. 15 shows a top view of a cap wafer utilized with the fabrication process of FIG. 14.
Figure 16:
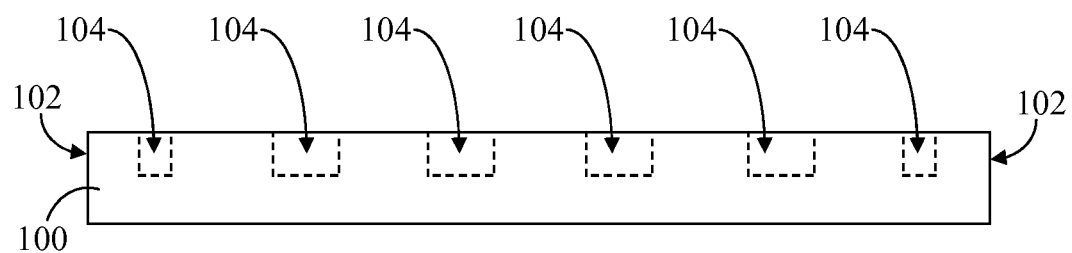
FIG. 16 shows a side view of the cap wafer of FIG. 15.

Referring to FIGS. 14-16, FIG. 14 shows a flowchart of a fabrication process 96 in accordance with an alternative embodiment. FIG. 15 shows a top view of a cap wafer 98 utilized with fabrication process 96, and FIG. 16 shows a side view of cap wafer 98. Cap wafer 98 includes an edge seal 100. Edge seal 100 may be integral to cap wafer 98 or a separate component bonded or otherwise coupled to cap wafer 98. Edge seal 100 may be utilized to couple cap wafer 98 with a device wafer, e.g., device wafer 20. Edge seal 100 may provide structural strength along an outer perimeter 102 of cap wafer 98 and/or may largely prevent contaminants from entering between device wafer 20 and cap wafer 98 during some processing operations.

Channels 104 may be formed extending inwardly from an inner cap surface 106 of cap wafer 98. However, channels 104 do not extend to outer perimeter 102 of cap wafer 98 due to the presence of edge seal 100. Since channels 104 do not extend to outer perimeter 102 of cap wafer 98, they are not visible in FIG. 16. Accordingly, channels 104 are represented in dashed line form in FIG. 16. Due to the inclusion of edge seal 100, soluble protective coating 68 (FIG. 6) applied in accordance with block 50 of fabrication process 46 (FIG. 4) may not be able to fill channels 104 to protect the terminal elements of the device wafer to which cap wafer 98 is being coupled. Fabrication process 96 may be performed when cap wafer 98 (or alternatively a device wafer) includes an edge seal to provide protection for the terminal elements during subsequent processing.

In a block 110 of fabrication process 96, a wafer structure is formed that includes cap wafer 98 with edge seal 100 coupled with device wafer 20 (FIG. 1). In a block 112, a back side grind process may be performed on outer surface 84 (FIG. 9) of device wafer 20 and/or on an outer cap surface 114 (depicted in FIG. 16) of cap wafer 98. Thereafter, an edge trim process may be performed to remove edge seal 100 from cap wafer 98.

In a block 116, soluble protective coating 68 (FIG. 6) is applied to the wafer structure following removal of edge seal 100. As in the methodology described above, block 116 generally entails melting soluble protective coating 68 from a solid form to a liquid form, submerging the wafer structure into the liquefied soluble protective coating 68, and allowing soluble protective coating 68 to return to a solid form on the bond pads residing in channels 104.

After soluble protective coating 68 has been applied in accordance with block 116, a block 118 entails a wafer processing operation. For example, a saw-to-reveal process may be performed to expose the terminal elements. At a block 120, soluble protective coating 68 is removed. Again, removal of soluble protective coating 68 at block 120 may be performed concurrent with the saw-to-reveal process of block 118 and/or the removal process of block 120 may be performed separate from the saw-to-reveal process.

After the soluble protective coating is removed at block 120, wafer probe testing may be performed at a block 122 to test the functionality of the devices on the device wafer using the exposed bond pads. Thereafter, the wafer structure may be sawn, diced, etched, or otherwise singulated into separate devices in accordance with a block 124. Additional activities that may ensue following singulation block 124 can include, for example, binning or otherwise sorting the devices, wire bonding with an application specific integrated circuit, overmolding, and so forth. These additional operations are not described herein for brevity. Thereafter, fabrication process 96 ends.

Embodiments of the present invention, discussed above, entail methodology for protecting terminal elements, such as bond pads, during wafer level fabrication processes. More particularly, a soluble protective coating is applied to the bond pads after a wafer bonding process, but prior to other processing operations such as wafer grinding and saw-to-reveal. The soluble protective coating can protect the bond pads and bond shelf from potentially damaging contaminants, such as debris from the grinding or saw-to-reveal operations. Furthermore, the soluble protective coating can protect the bond pads from coming into contact with a rapidly oxidizing environment when exposed to water. The protective coating can be readily removed after completion of any such processing that may produce contaminants capable of damaging the bond pads. Moreover, depending upon the type of protective coating that is used, the protective coating may not require any additional removal operations to be incorporated into the fabrication process. Thus, the methodology disclosed herein can cost effectively improve device yield and manufacturability.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A method for protecting terminal elements of a wafer structure, said wafer structure including a first wafer coupled with a second wafer, said terminal elements being located on a first inner surface of said first wafer, said first inner surface being coupled to a second inner surface of said second wafer, said second wafer including channels extending inwardly from said second inner surface and partially through a thickness of said second wafer, said channels being arranged facing said terminal elements, said wafer structure is without an edge seal, and said method comprising:

applying a soluble protective coating over said terminal elements, said applying comprising fully submerging said wafer structure into a reservoir of said soluble protective coating such that said soluble protective coating flows between said first and second inner surfaces at an edge of said wafer structure and into contact with said terminal elements, said submerging causing said soluble protective coating to flow into said channels;

processing said wafer, wherein said processing produces contaminants capable of damaging said terminal elements and said soluble protective coating protects said terminal elements from damage by said contaminants during said processing; and removing said soluble protective coating from said terminal elements following said processing.

2. The method of claim 1 wherein said applying said soluble protective coating is performed after said first wafer is coupled with said second wafer.

3. The method of claim 1 wherein said soluble protective coating is in a solid form, and said method further comprises:

heating said soluble protective coating to a temperature sufficient to cause said soluble protective coating to liquefy, said applying being performed after said soluble protective coating is liquefied; and allowing said soluble protective coating applied over said terminal elements to solidify prior to said processing.

4. The method of claim 3 wherein said soluble protective coating is in a liquid form at a temperature of at least fifty-five degrees Celsius, and said heating comprises increasing said temperature of said soluble protective coating to said at least fifty-five degrees Celsius.

5. The method of claim 1 wherein said submerging comprises orienting said wafer structure such that a longitudinal dimension of said channels is oriented approximately perpendicular to a surface of said soluble protecting coating.

6. The method of claim 1 wherein said processing comprises grinding an outer surface of said wafer to thin said wafer.

7. The method of claim 1 wherein said processing comprises removing a portion of said second wafer overlying said terminal elements to reveal said terminal elements.

8. The method of claim 7 wherein said soluble protective coating is a water soluble protective coating, said removing said portion of said second wafer includes rinsing away debris from said second wafer with water, said rinsing additionally dissolving said water soluble protective coating.

9. The method of claim 1 wherein said soluble protective coating comprises a water soluble protective coating, and said removing comprises dissolving said water soluble protective coating in water.

10. The method of claim 9 wherein said water soluble protective coating comprises a thermoplastic material, and said removing comprises heating said water to a temperature sufficient to cause said soluble protective coating to go to solution and release from said terminal elements.

11. The method of claim 1 wherein said first wafer includes a plurality of devices formed thereon, and said method further comprises separating said wafer structure to produce separated ones of said plurality of devices, each of said devices including at least one of said terminal elements.

12. A method for protecting terminal elements of a wafer structure, said wafer structure including a first wafer coupled with a second wafer, said terminal elements being located on a first inner surface of said first wafer, and said method comprising:

applying a soluble protective coating over said terminal elements, said applying being performed after said first wafer is coupled with said second wafer;

processing said wafer structure, said processing including removing a portion of said second wafer overlying said terminal elements to reveal said terminal elements, wherein said processing produces contaminants capable of damaging said terminal elements and said soluble protective coating protects said terminal elements from damage by said contaminants during said processing; and removing said soluble protective coating following said processing.

13. The method of claim 12 wherein said soluble protective coating is a water soluble protective coating, said removing a portion of said second wafer includes rinsing away debris from said second wafer with water, said rinsing additionally dissolving said water soluble protective coating.

14. The method of claim 12 wherein said soluble protective coating comprises a water soluble protective coating, and said removing comprises:

heating water to a temperature sufficient to cause said soluble protective coating to go to solution; and dissolving said water soluble protective coating using said heated water to release said water soluble protective coating from said terminal elements.

15. A method for protecting terminal elements of a wafer structure, said wafer structure including a first wafer coupled with a second wafer, said terminal elements being located on a first inner surface of said first wafer, said first inner surface being coupled to a second inner surface of said second wafer, said second wafer includes channels extending from said second inner surface and partially through a thickness of said second wafer, said channels being arranged facing said terminal elements, said wafer structure is without an edge seal, and said method comprising:

heating a water soluble protective coating to a temperature sufficient to cause said soluble protective coating to change from a solid form to a liquid form;

applying said water soluble protective coating in said liquid form over said terminal elements, wherein said applying comprises fully submerging said wafer structure into a reservoir of said water soluble protective coating such that said water soluble protective coating flows between said first and second inner surfaces at an edge of said wafer structure and in contact with said terminal elements, said submerging comprises orienting said wafer structure such that a longitudinal dimension of said channels is oriented approximately perpendicular to a surface of said soluble protecting coating, and said submerging causes said soluble protective coating to flow into said channels;

processing said wafer structure, wherein said processing produces contaminants capable of damaging said terminal elements and said soluble protective coating protects said terminal elements from damage by said contaminants during said processing; and removing said water soluble protective coating following said processing, wherein said removing includes dissolving said water soluble protective coating in water heated to said temperature.

16. The method of claim 15 wherein:

said water soluble protective coating comprises a thermoplastic material;

said heating comprises heating said water soluble protective coating to at least fifty-five degrees Celsius; and said removing comprises heating said water to said at least fifty-five degrees Celsius to cause said water soluble protective coating to go to solution and release from said terminal elements.

* * * * *